United States Patent
Park et al.

(10) Patent No.: US 10,522,716 B2
(45) Date of Patent: Dec. 31, 2019

(54) SEMICONDUCTOR LIGHT EMITTING DEVICE

(71) Applicant: SEOUL VIOSYS CO., LTD., Ansan-si (KR)

(72) Inventors: Seung Chul Park, Ansan-si (KR); Woo Chul Gwak, Ansan-si (KR); Jun Ho Yun, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/917,445

(22) Filed: Mar. 9, 2018

(65) Prior Publication Data

US 2018/0261724 A1 Sep. 13, 2018

(30) Foreign Application Priority Data

Mar. 9, 2017 (KR) .................. 10-2017-0029931

(51) Int. Cl.
*H01L 33/24* (2010.01)
*H01L 33/06* (2010.01)
*H01L 33/14* (2010.01)
*H01L 33/32* (2010.01)
*H01L 33/00* (2010.01)
*H01L 33/12* (2010.01)
*H01L 33/22* (2010.01)
*H01L 33/02* (2010.01)

(52) U.S. Cl.
CPC .......... *H01L 33/24* (2013.01); *H01L 33/0075* (2013.01); *H01L 33/02* (2013.01); *H01L 33/025* (2013.01); *H01L 33/06* (2013.01); *H01L 33/12* (2013.01); *H01L 33/14* (2013.01); *H01L 33/22* (2013.01); *H01L 33/32* (2013.01)

(58) Field of Classification Search
CPC ....... H01L 33/26; H01L 33/14; H01L 33/145; H01L 33/02; H01L 33/12; H01L 33/22; H01L 33/24; H01L 33/025
See application file for complete search history.

(56) References Cited

U.S. PATENT DOCUMENTS

| | | | | |
|---|---|---|---|---|
| 6,136,626 A * | 10/2000 | Kidoguchi | ............ | H01L 33/007 257/13 |
| 7,446,345 B2 * | 11/2008 | Emerson | .................. | H01L 33/24 257/95 |
| 9,029,832 B2 * | 5/2015 | Okuno | .................... | H01L 33/02 257/13 |
| 9,178,114 B2 * | 11/2015 | Ting | .................. | H01L 21/02505 |
| 2007/0153851 A1 * | 7/2007 | Kiesel | ..................... | H01S 5/026 372/43.01 |
| 2010/0032649 A1 * | 2/2010 | Lin | ......................... | H01L 33/04 257/13 |

(Continued)

*Primary Examiner* — Cuong Q Nguyen
*Assistant Examiner* — Shih Tsun A Chou
(74) *Attorney, Agent, or Firm* — Perkins Coie LLP (57) ABSTRACT

Described herein is a semiconductor light emitting device. The semiconductor light emitting device comprises: an n-type semiconductor layer; a V-pit formed through at least part of the n-type semiconductor layer; an active layer disposed on the n-type semiconductor layer and filling the V-pit; and a p-type semiconductor layer disposed on the active layer, wherein the active layer includes a plurality of layers and part of the plural layers has a flat shape on the V-pit.

18 Claims, 5 Drawing Sheets

(56) References Cited

U.S. PATENT DOCUMENTS

| | | | |
|---|---|---|---|
| 2010/0155704 A1* | 6/2010 | Oh | H01L 21/0237 257/28 |
| 2011/0309327 A1* | 12/2011 | Jeong | H01L 33/025 257/13 |
| 2012/0161151 A1* | 6/2012 | Rana | H01L 21/02381 257/76 |
| 2012/0205618 A1* | 8/2012 | Nakamura | H01L 33/007 257/13 |
| 2014/0225059 A1* | 8/2014 | Yang | H01L 33/145 257/13 |
| 2014/0332756 A1* | 11/2014 | Kashihara | H01L 33/24 257/22 |
| 2015/0083993 A1* | 3/2015 | Nagata | H01L 33/06 257/13 |
| 2015/0221826 A1* | 8/2015 | Yang | H01L 33/24 257/13 |
| 2015/0311380 A1* | 10/2015 | Solari | H01L 21/0254 438/46 |
| 2016/0087147 A1* | 3/2016 | Yamane | H01L 33/20 257/13 |
| 2016/0276537 A1* | 9/2016 | Nakamura | H01L 33/24 |
| 2018/0062037 A1* | 3/2018 | Togawa | H01L 33/06 |
| 2018/0062039 A1* | 3/2018 | Fujiwara | H01L 33/06 |

\* cited by examiner

SEMICONDUCTOR LIGHT EMITTING DEVICE

CROSS-REFERENCE TO RELATED APPLICATION(S)

This patent document claims priority to and the benefit of Korean Patent Application No. 10-2017-0029931, filed on Mar. 9, 2017, which are incorporated herein by reference for all purposes as if fully set forth herein.

TECHNICAL FIELD

Exemplary embodiments described in the present document relate to a semiconductor light emitting device which includes a semiconductor light emitting device having improved electrostatic discharge characteristics.

BACKGROUND

Generally, heterogeneous substrates are used for growth of nitride-based semiconductor layers in a viewpoint of economic feasibility. For example, sapphire substrates are widely used for growth of nitride-based semiconductor layers. In a nitride-based semiconductor layer grown on a heterogeneous substrate, strain can be generated due to a difference in lattice constant between the substrate and the growth layer, thereby causing crystal defects. In particular, treading dislocation causes current leakage and weak electrostatic characteristics, thereby causing deterioration in reliability of a semiconductor light emitting device.

SUMMARY

Exemplary embodiments described in the present document provide a semiconductor light emitting device having improved electrostatic characteristics.

Exemplary embodiments described in the present document provide a semiconductor light emitting device having improved luminous efficacy.

In accordance with one aspect described in the present document, a semiconductor light emitting device includes: an n-type semiconductor layer; a V-pit formed through at least part of the n-type semiconductor layer; an active layer disposed on the n-type semiconductor layer and filling the V-pit; and a p-type semiconductor layer disposed on the active layer, wherein the active layer includes a plurality of layers and part of the plural layers has a flat shape on the V-pit.

Exemplary embodiments described in the present document provide a semiconductor light emitting device having improved electrostatic characteristics using a V-pit while improving luminous efficacy by preventing reduction in luminous area.

In some implementations, the active layer may include a first active layer disposed on the n-type semiconductor layer and affecting increase in diameter and height of the V-pit. An uppermost end of the V-pit may have a diameter of 100 nm more. In some implementations, the active layer may include a second active layer disposed on the n-type semiconductor layer and affecting decrease in diameter of the V-pit while filling the V-pit. In some implementations, the second active layer may be disposed on the first active layer. The second active layer may completely fill the V-pit. In addition, the second active layer may include hydrogen molecules $H_2$ due to use of the hydrogen molecules ($H_2$) as a carrier gas during growth thereof.

In some implementations, the active layer may further include a third active layer disposed on the V-pit filled by the second active layer and having a continuous flat shape. In some implementations, the active layer may include a structure in which plural barrier layers and quantum well layers are alternately stacked one above another, and each of the second active layer and the third active layer may include at least one barrier layer and at least one quantum well layer. Here, the barrier layer may include a GaN layer and the quantum well layer may include an InGaN layer. In some implementations, the semiconductor light emitting device may further include a substrate having a different crystal structure than the n-type semiconductor layer.

In some implementations, the n-type semiconductor layer may include a first n-type semiconductor layer disposed on the substrate and including a dislocation caused by a difference in crystal structure; and a second n-type semiconductor layer disposed on the first n-type semiconductor layer, and the first n-type semiconductor layer may have better crystal quality than the second n-type semiconductor layer. In some implementations, the V-pit may be formed from the second n-type semiconductor layer corresponding to a location of the dislocation in the first n-type semiconductor layer. In some implementations, the semiconductor light emitting device may further include a super-lattice layer interposed between the n-type semiconductor layer and the active layer. In some implementations, the super-lattice layer may affect increase in diameter and height of the V-pit. In some implementations, the semiconductor light emitting device may further include an electron blocking layer interposed between the active layer and the p-type semiconductor layer.

DETAILED DESCRIPTION

Hereinafter, exemplary embodiments described in the present document will be described in detail with reference to the accompanying drawings. The disclosed technology is not limited to the embodiments disclosed herein and can also be implemented in different forms. In the drawings, widths, lengths, thicknesses, and the like of elements can be exaggerated for clarity and descriptive purposes. When an element is referred to as being "disposed above" or "disposed on" another element, it can be directly "disposed above" or "disposed on" the other element, or intervening elements can be present. Throughout the specification, like reference numerals denote like elements having the same or similar functions.

In some semiconductor light emitting devices including a nitride-based semiconductor layer, a V-shaped pit, that is, a V-pit, is formed in a region where the threading dislocation is generated. The V-pit has a slope in a direction different from a growth direction of the nitride-based semiconductor layer. The V-pit is formed by adjusting growth conditions of the nitride-based semiconductor layer. The slope of the V-pit has a lower growth rate and lower doping efficiency than a growth direction plane, and a region with high energy barrier and low electric conductivity, that is, a high resistance region, is formed near the threading dislocation. The V-pit may have, in a sectional view, the appearance of the letter "V", with two substantially linear features joined by an acute angle at the base, and sloping away from each other in the opposite direction. A semiconductor light emitting device having enhanced electrostatic characteristics can be realized by eliminating the threading dislocation from impact such as electrostatic discharge using a difference in resistance between the growth plane of the nitride-based semiconductor layer and the V-pit slope.

Figure 1:
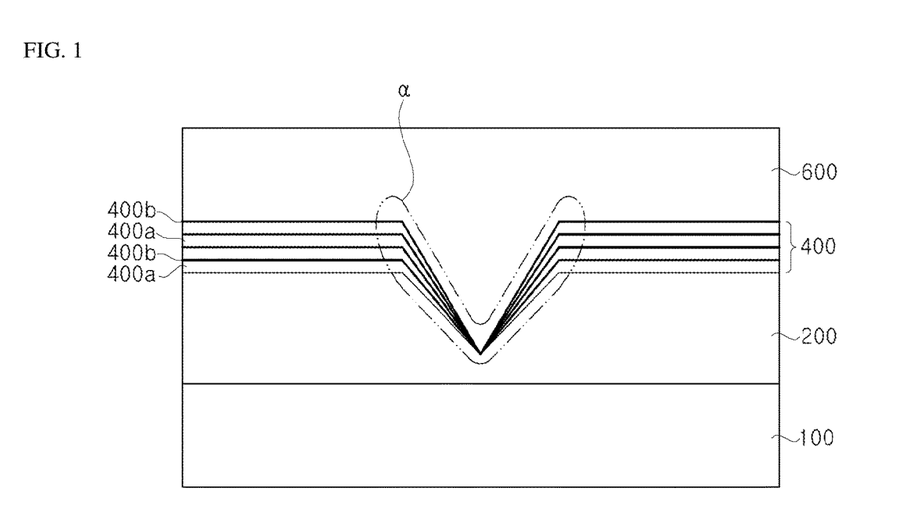
FIG. 1 is a sectional view of a typical semiconductor light emitting device including a V-pit.

FIG. 1 is a sectional view of a typical semiconductor light emitting device including a V-pit (α). Referring to FIG. 1, the semiconductor light emitting device includes a substrate 100 and a semiconductor stack structure, which includes an n-type semiconductor layer 200, a p-type semiconductor layer 600, and an active layer 400 interposed between the n-type semiconductor layer 200 and the p-type semiconductor layer 600. Here, the active layer 400 has a structure in which barrier layers 400a and quantum well layers 400b are alternately stacked one above another.

In such a typical semiconductor light emitting device, the V-pit (α) is generated from the n-type semiconductor layer 200 and is formed over the active layer 400. The p-type semiconductor layer 600 is formed on the active layer 400 to fill the V-pit (α). Referring to FIG. 1, although the V-pit (α) has an advantage of improving reliability of the semiconductor light emitting device through improvement in electrostatic characteristics, a region of the active layer 400 occupied by the V-pit (α) cannot be used as a luminous region based on recombination of electrons and holes, thereby reducing a luminous area.

With the recognition of the disadvantage above, various aspects of devices are disclosed to provide a semiconductor light emitting device having improved electrostatic characteristics and/or improved luminous efficacy.

Figure 2:
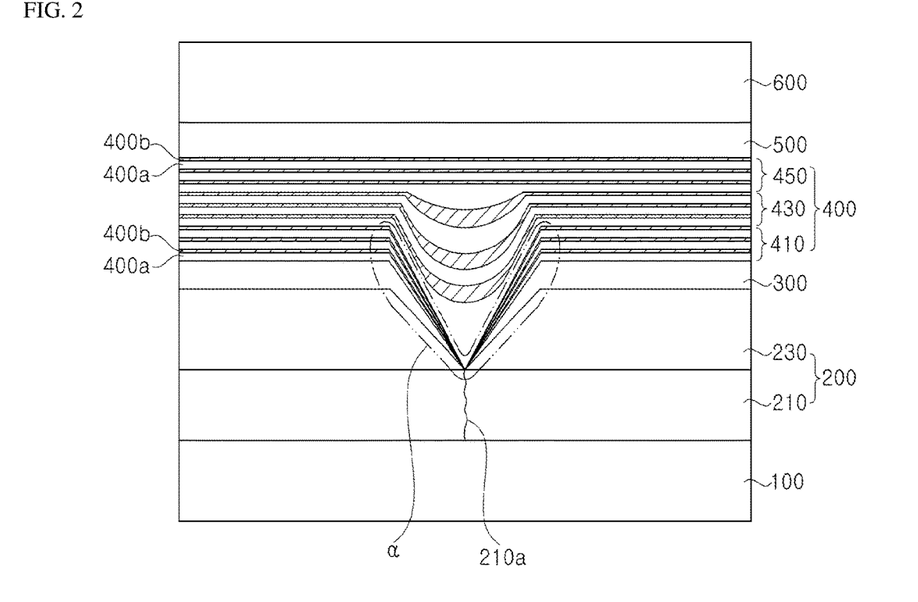
FIG. 2 is a sectional view of a semiconductor light emitting device including a V-pit according to one exemplary embodiment described in the present document.

FIG. 2 is a sectional view of a semiconductor light emitting device according to one exemplary embodiment described in the present document. The semiconductor light emitting device according to the exemplary embodiment may include a substrate 100 and a nitride semiconductor layer. The nitride semiconductor layer may include an n-type semiconductor layer 200, an active layer 400, and a p-type semiconductor layer 600. The nitride semiconductor layer may further include a super-lattice layer 300 interposed between the n-type semiconductor layer 200 and the active layer 400 and/or an electron blocking layer 500 interposed between the active layer 400 and the p-type semiconductor layer 600.

The substrate 100 is selected from any substrates suitable for growth of nitride semiconductor crystals thereon and may include a sapphire (Al2O3) substrate, a gallium nitride (GaN) substrate, a gallium arsenide (GaAs) substrate, a silicon (Si) substrate, a silicon carbide (SiC) substrate, or an aluminum nitride (AlN) substrate, or the combination thereof. The substrate 100 may have a polar or semi-polar growth plane. In some implementations, the semiconductor light emitting device according to the exemplary embodiment may employ a sapphire substrate having a different crystal structure than the nitride semiconductor layer. The growth (polar) plane of the sapphire substrate is the c-plane and the sapphire substrate has thermal, chemical and mechanical stability while securing economic feasibility. Alternatively, the substrate 100 may be removed from the light emitting device.

The n-type semiconductor layer 200 may be disposed on the substrate 100. The n-type semiconductor layer 200 may include a nitride semiconductor layer such as (Al, Ga, In)N. For example, the n-type semiconductor layer 200 may include a GaN layer. The n-type semiconductor layer 200 may include a first n-type semiconductor layer 210 and a second n-type semiconductor layer 230. Here, the first n-type semiconductor layer 210 and the second n-type semiconductor layer 230 may be grown under different conditions of doping concentration and growth temperature.

The first n-type semiconductor layer 210 may be disposed on the substrate 100. The first n-type semiconductor layer 210 may be grown to exhibit n-type polarity by introducing n-type dopant precursors into a chamber. The first n-type semiconductor layer 210 may be grown at a high temperature of, for example, about 1,000° C. or more. The first n-type semiconductor layer 210 may be composed of a single layer or multiple layers.

The nitride semiconductor layer may be grown on the substrate 100 placed in the chamber by metal organic chemical vapor deposition (MOCVD), without being limited thereto. Alternatively, the nitride semiconductor layer may be grown on the substrate by molecular beam epitaxy (MBE), hydride vapor phase epitaxy (HVPE), or the like.

The nitride semiconductor layer may have a treading dislocation. When the substrate 100 is a heterogeneous substrate such as a sapphire substrate, which has a different crystal structure than the nitride semiconductor layer, a large amount of dislocations, for example, treading dislocations 210a, can be formed in the nitride semiconductor layer. The nitride semiconductor layer such as the first n-type semiconductor layer 210 has a Wurtzite crystal structure, whereas the sapphire substrate 100 has a corundum crystal structure. Thus, the first n-type semiconductor layer 210 may have a treading dislocation density of about $1 \times 10^8$ to $10^9/cm^2$ due to a difference in lattice constant between the sapphire substrate 100 and the nitride semiconductor layer.

The treading dislocations 210a in the first n-type semiconductor layer 210 can provide electron trap sites causing unintentional behavior of electrons (for example, non-luminous recombination of electrons and holes in the semiconductor light emitting device) and current leakage paths. Accordingly, when overvoltage such as static electricity is applied to the semiconductor light emitting device, current crowding occurs in the dislocations, thereby causing damage to the semiconductor light emitting device through electrostatic discharge.

The second n-type semiconductor layer 230 may be disposed on the first n-type semiconductor layer 210. According to one exemplary embodiment, the second n-type semiconductor layer 230 may have a lower concentration of n-type dopants than the first n-type semiconductor layer 210. Alternatively, the second n-type semiconductor layer 230 may not be doped with the n-type dopants. In addition, the second n-type semiconductor layer 230 may be grown at a lower temperature, for example, at about 800° C. to 900° C., than the first n-type semiconductor layer 210, and thus may have lower crystal quality than the first n-type semiconductor layer 210. Accordingly, the second n-type semiconductor layer 230 may have a relatively high defect density.

As the second n-type semiconductor layer 230 has a relatively high defect density, the second n-type semiconductor layer 230 can provide starting points or seeds for V-pits (α). The second n-type semiconductor layer 230 may also be referred to as a V-pit (α) generation layer. Thus, there is no need for a separate etching process for formation of V-pits (α) in the semiconductor light emitting device.

The V-pits (α) may be formed at locations corresponding to the locations of the treading dislocations 210a in the first n-type semiconductor layer 210. The size and density of the V-pits (α) may be controlled through the control of growth conditions for the second n-type semiconductor layer 230. For example, the size of the V-pits (α) may be proportional to the thickness of the second n-type semiconductor layer 230 and the density of the V-pits (α) may be adjusted depending upon defect density corresponding to growth conditions of the second n-type semiconductor layer 230.

Since the slope of the V-pit (α) exhibits semi-polar characteristics, it can be more difficult for dopants to enter the V-pits (α) than the growth direction plane of the second n-type semiconductor layer 230, which exhibits polar characteristics. Accordingly, the slope of the V-pit (α) is resistant to doping and can exhibit higher resistance than surrounding regions thereof. Due to such high resistance of the slope of the V-pit (α), a high energy barrier layer is formed on the slope of the V-pit (α). Since such a high energy barrier layer has a relatively low growth rate on the slope of the V-pit (α) and an InGaN layer having a relatively low energy bandgap is unlikely to be formed thereon, the high energy barrier layer is formed by increasing the bandgap. Accordingly, the high energy barrier layer can prevent current flow through the treading dislocation 200a by preventing electrons in the active layer 400 from escaping through the treading dislocation 200a, thereby preventing damage to the semiconductor light emitting device by electrostatic discharge (ESD).

The super-lattice layer 300 may be disposed on the second n-type semiconductor layer 230. The super-lattice layer 300 includes a nitride semiconductor layer such as an (Al, In, Ga)N layer and may include a stacked structure of plural layers. Further, the super-lattice layer 300 may have a stacked structure in which small bandgap layers and large bandgap layers are alternately stacked one above another. For example, the super-lattice layer 300 may include a stacked structure in which InGaN layers and GaN layers are alternately stacked one above another or a stacked structure in which InGaN layers and InAlGaN layers are alternately stacked one above another.

The super-lattice layer 300 can prevent propagation of defects such as dislocation by relieving stress and strain applied to the active layer 400 due to lattice mismatch between the nitride semiconductor layers and the substrate 100 having a different crystal structure than the nitride semiconductor layers. Accordingly, the super-lattice layer 300 can improve crystal quality of the active layer 400.

Referring to FIG. 2, the super-lattice layer 300 may be grown in the same direction as the growth direction plane of the second n-type semiconductor layer 230 and may also be formed on the slope of the V-pit (α). That is, the V-pit (α) may be partially filled with the super-lattice layer 300.

As described above, the slope of the V-pit (α) has a relatively low growth rate. Thus, the super-lattice layer 300 formed on the slope of the V-pit (α) may have a smaller thickness than the super-lattice layer 300 grown in the same direction as the growth plane of the second n-type semiconductor layer 230. As a result, the size of the V-pit (α) formed in the second n-type semiconductor layer 230 can be increased. The thickness of the V-pit (α) can increase in proportion to the thickness of the super-lattice layer 300 and the diameter of the V-pit (α) can also increase in proportion to the increase in thickness thereof.

The active layer 400 may be disposed on the super-lattice layer 300. The active layer 400 emits light through recombination of electrons and holes. The active layer 400 may include a multi-quantum well structure in which barrier layers 400a and quantum well layers 400b are alternately stacked one above another. The barrier layer 400a may be formed to have a greater thickness than the quantum well layer 400b. For example, the barrier layer 400a may have a thickness of 5 nm and the quantum well layers 400b may have a thickness of 3 nm.

The active layer 400 may be disposed on the super-lattice layer 300. The active layer 400 emits light through recombination of electrons and holes. The active layer 400 may include a multi-quantum well structure in which barrier layers 400a and quantum well layers 400b are alternately stacked one above another. The barrier layer 400a may be formed to have a greater thickness than the quantum well layer 400b. For example, the barrier layer 400a may have a thickness of 5 nm and the quantum well layers 400b may have a thickness of 3 nm.

The barrier layer 400a may include a nitride semiconductor layer having a broader energy bandgap than the quantum well layer 400b, for example, a GaN layer, an InGaN layer, an AlGaN layer or an AlInGaN layer. The quantum well layer 400b may include a nitride semiconductor layer having a narrower energy bandgap than the barrier layer 400a. For example, the active layer 400 may include a multi-quantum well structure in which the barrier layers 400a including GaN layers and the quantum well layers 400b including InGaN layers are alternately stacked one above another. The active layer 400 may be formed to emit light having a desired wavelength by adjusting the composition ratio of the nitride semiconductor layer for the quantum well layers 400b. In some implementations, the semiconductor light emitting device according to the exemplary embodiment may include the barrier layers 400a formed of or including GaN and the quantum well layers 400b formed of or including InGaN to emit blue or green light.

In the active layer 400, the barrier layers 400a and the quantum well layers 400b may be formed as undoped layers which are not doped with dopants in order to improve crystal quality in an active region. Here, the active layer 400 may include a partial or entire active region doped with dopants in order to reduce forward voltage.

The active layer 400 may include a first active layer 410, a second active layer 430 and a third active layer 450, which are classified according to formation sequence and growth method. Each of the first active layer 410, the second active layer 430 and the third active layer 450 may include at least one barrier layer 400a and a quantum well layer 400b.

Referring to FIG. 2, the first active layer 410 is disposed on the super-lattice layer 300 and may include a stacked structure wherein barrier layers 400a and quantum well layers 400b are alternately stacked one above another. In the first active layer 410, the number of barrier layers 400a and the number of quantum well layers 400b relate to the size of the V-pit α to be realized in the semiconductor light emitting device. Like the super-lattice layer 300, the first active layer 410 may be formed on the slope of the V-pit (α), which includes a different plane than the growth direction plane of the nitride semiconductor layer. Thus, the V-pit (α) may be partially filled with the first active layer 410. Here, the slope of the V-pit (α) has a relatively low growth rate, thereby causing the first active layer 410 formed on the slope of the V-pit (α) to have a very small thickness, as compared with the thickness of the first active layer 410 formed on the super-lattice layer 300. Thus, the size of the V-pit (α) formed on the second n-type semiconductor layer 230 and the super-lattice layer 300 can be increased. That is, the thickness of the V-pit (α) can be increased corresponding to the thickness of the first active layer 410 and the diameter of the V-pit (α) can also be increased in proportion to increase in thickness thereof.

As a result, the size of the V-pit (α) can be determined based on the thicknesses of the second n-type semiconductor layer 230, the super-lattice layer 300 and the first active layer 410.

In order to realize improvement in ESD prevention by the V-pit (α), the V-pit (α) is required to have a predetermined size or more. Accordingly, the first active layer 410 has a thickness such that the V-pit (α) is formed to a thickness of greater than 100 nm, and may include a plurality of barrier layers 400a and a plurality of quantum well layers 400b corresponding thereto. If the V-pit (α) formed through the second n-type semiconductor layer 230 and the super-lattice layer 300 has a sufficient thickness, the first active layer 410 can be omitted. In this case, the size of the V-pit (α) may be determined based on the thicknesses of the second n-type semiconductor layer 230 and the super-lattice layer 300.

The second active layer 430 may be disposed on the first active layer 410. Like the first active layer 410, the second active layer 430 may include at least one barrier layer 400a and at least one quantum well layer 400b. Thus, the second active layer 430 may be formed by alternately repeating a process of forming the barrier layer 400a and a process of forming the quantum well layer 400b.

Conditions for growth of the at least one barrier layer 400a included in the second active layer 430 may be different from the conditions for growth of the at least one barrier layer 400a included in the first active layer 410. First, the barrier layer 400a included in the second active layer 430 may be formed using not only $N_2$ but also $H_2$ as a carrier gas and may be grown at a low growth rate by controlling the flow rate of a source gas introduced into a chamber. Further, the barrier layer 400a included in the second active layer 430 may be grown at a relatively high temperature, for example, about 900° C. Since $H_2$ is used as a carrier gas in growth of the second active layer 430, the second active layer 430 may contain a large amount of $H_2$ unlike the first active layer 410.

When the second active layer 430 is grown using $H_2$ as a carrier gas at a low growth rate through control of the amount of sources injected into the chamber at high temperature, growth of the second active layer 430 can be promoted in the horizontal direction. Since $H_2$ has a much lower molecular weight than $N_2$, $H_2$ can have very large kinetic energy by thermal energy applied to the chamber, whereby sources such as Ga, N, and the like introduced into the chamber can be deposited over a large area on the first active layer 410, thereby promoting lateral growth of the second active layer 430 thereon.

Furthermore, the amount of sources such as Ga, N, and the like to be deposited on the V-pit (α) can be increased due to $H_2$ having high momentum. As the process of forming the barrier layer 400a of the second active layer 430 and the process of forming the quantum well layer 400b are alternately repeated, the V-pit (α) formed through the second n-type semiconductor layer 230, the super-lattice layer 300, and the first active layer 410 can be gradually filled, as shown in FIG. 2. That is, as shown in FIG. 2, as the second active layer 430 is grown, the diameter of the V-pit (α) gradually decreases such that the V-pit (α) is filled with the barrier layer 400a and the quantum well layer 400b, whereby the V-pit (α) can be completely filled with the second active layer 430.

The third active layer 450 may be formed on the second active layer 430. The V-pit (α) may be completely filled with the second active layer 430 such that the third active layer 450 is not formed on the slope of the V-pit (α). The third active layer 450 disposed on the second active layer 430, particularly the third active layer 430 disposed on the V-pit (α), includes at least one quantum well layer 400b. In addition, the quantum well layer 400b may have a flat structure. With the quantum well layers 400b having such a continuous flat structure, the semiconductor light emitting device can secure a sufficient luminous region while including the V-pit (α).

The third active layer 450 may further include at least one barrier layer 400a. The growth condition of the barrier layer 400a of the third active layer 450 may be the same as the growth condition of the barrier layer 400a of the second active layer 430. Alternatively, the growth condition of the barrier layer 400a of the third active layer 450 may be the same as the growth condition of the barrier layer 400a of the first active layer 410.

As a result, the semiconductor light emitting device according to the exemplary embodiment includes the quantum well layer 400b formed on the V-pit (α), thereby improving an ESD prevention effect without deteriorating output.

The electron blocking layer 500 may be formed on the active layer 400. The electron blocking layer 500 can prevent electrons from overflowing from the active layer 400 to the p-type semiconductor layer 600. The electron blocking layer 500 may include a nitride semiconductor layer generally having a broader energy bandgap than the p-type semiconductor layer 600.

The p-type semiconductor layer 600 may be formed on the electron blocking layer 500. The p-type semiconductor layer 600 may include a nitride semiconductor layer, such as (Al, In, Ga)N, and may be grown on the electron blocking layer 500 by MOCVD or the like. The p-type semiconductor layer 600 may include p-type dopants, for example, Mg dopants.

FIG. 3 to FIG. 11 show a method of manufacturing the semiconductor light emitting device according to the exemplary embodiment.

Nitride semiconductor layers of the semiconductor light emitting device may be grown on a substrate 100 placed in a chamber by metal organic chemical vapor deposition (MOCVD). Accordingly, the method of manufacturing the semiconductor light emitting device described below may be applied to a process of growing the nitride semiconductor layers through MOCVD. However, it should be understood that other implementations are also possible. According to other exemplary embodiments, the nitride semiconductor layer may be grown by molecular beam epitaxy (MBE), hydride vapor phase epitaxy (HVPE), and others.

Figure 3:
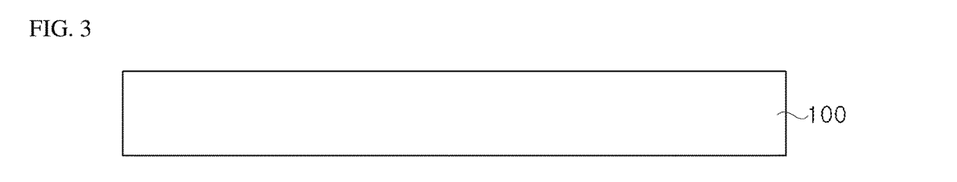
FIG. 3 to FIG. 11 are schematic sectional views illustrating a method of manufacturing a semiconductor light emitting device according to one exemplary embodiment described in the present document.

Referring to FIG. 3, the substrate 100 is prepared. The substrate 100 may be a heterogeneous substrate such as a sapphire substrate, which has a different crystal structure than the nitride semiconductor layers. The growth (polar) plane of the sapphire substrate has the c-plane.

Figure 4:
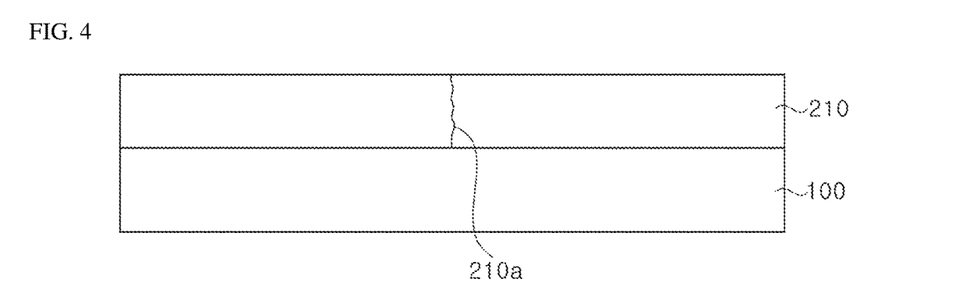

Referring to FIG. 4, a first n-type semiconductor layer 210 may be grown on the substrate 100.

The first n-type semiconductor layer 210 may be formed by growing an n-type nitride semiconductor layer through introduction of a group III element source, an N source and n-type dopant precursors into a chamber. For example, the first n-type semiconductor layer 210 may be formed by growing an n-type GaN layer through introduction of TMGa (trimethylgallium) or TEGa (Triethylgallium) as the Ga source, $NH_3$ as the N source, and an Si dopant precursor into the chamber.

The first n-type semiconductor layer 210 may be grown at a relatively high temperature to have a relatively low defect density. For example, the first n-type semiconductor layer 210 may be grown at a high temperature of about 1,000° C. or more. In addition, the first n-type semiconductor layer 210 may be composed of a single layer or multiple layers.

Here, the first n-type semiconductor layer 210 may have a different lattice constant than the substrate 100 and thus may include a lattice mismatch dislocation, for example, a treading dislocation 210a. Although FIG. 4 shows that the first n-type semiconductor layer 210 may include a single treading dislocation 210a, the first n-type semiconductor layer 210 may include a plurality of treading dislocations in other exemplary embodiments.

The method of forming the semiconductor light emitting device according to the exemplary embodiment may further include a process of forming a buffer layer (not shown) disposed between the substrate 100 and the first n-type semiconductor layer 210 to relieve stress and strain caused by lattice mismatch between the substrate and the first n-type semiconductor layer.

Figure 5:
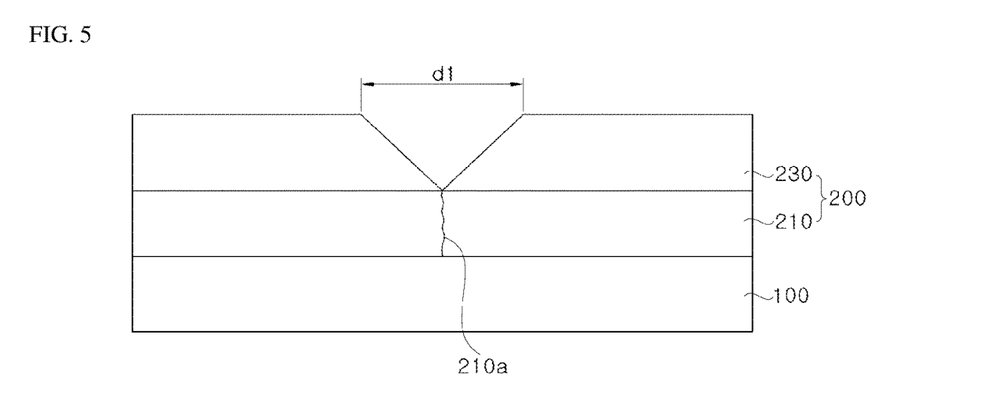

Referring to FIG. 5, a second n-type semiconductor layer 230 may be formed on the first n-type semiconductor layer 210.

The second n-type semiconductor layer 230 may be formed by introducing a group III element source and an N source into the chamber while introducing an n-type dopant precursor thereto. The flow rate of the n-type dopant precursor may be adjusted so as to allow the second n-type semiconductor layer 230 to have a lower doping concentration than the first n-type semiconductor layer 210. Alternatively, the second n-type semiconductor layer 230 may include an undoped GaN layer or InGaN layer, which does not require the n-type dopant precursor.

In addition, the second n-type semiconductor layer 230 may be formed on the first n-type semiconductor layer 210 at a relatively low temperature. For example, the second n-type semiconductor layer 230 may be formed at a low temperature of about 800° C. to 900° C. Accordingly, the second n-type semiconductor layer 230 may have a higher defect density than the first n-type semiconductor layer 210.

The second n-type semiconductor layer 230 may be formed to have a relatively high defect density to provide starting points or seeds for V-pits ($\alpha$). In particular, when the second n-type semiconductor layer 230 includes indium (In), indium (In) can promote generation of the V-pits ($\alpha$). The V-pits ($\alpha$) may be formed at locations corresponding to treading dislocations in the first n-type semiconductor layer 210. The size of the V-pit ($\alpha$), that is, the height and diameter (d1) of the V-pit, can be controlled through control of growth conditions for the second n-type semiconductor layer 230.

Although FIG. 5 shows a single V-pit ($\alpha$) for convenience of description, the second n-type semiconductor layer 230 may include a plurality of V-pits ($\alpha$), which may have the same or different sizes.

Figure 6:
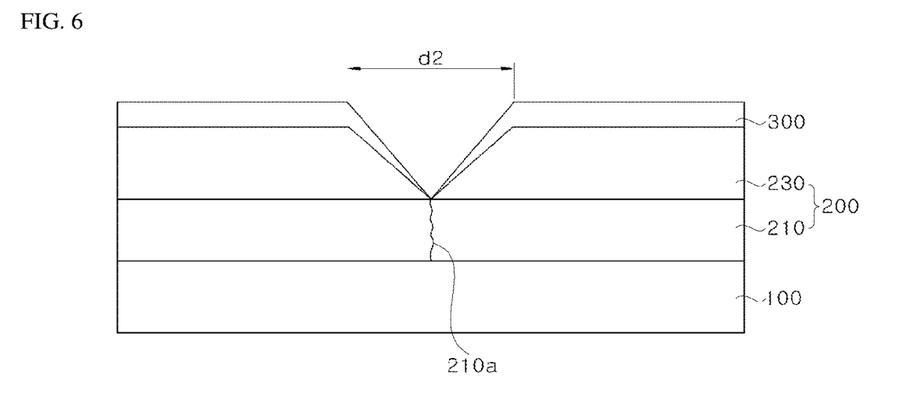

Referring to FIG. 6, a super-lattice layer 300 may be formed on the second n-type semiconductor layer 230. The super-lattice layer 300 may include a stacked structure in which InGaN layers and GaN layers are alternately stacked one above another or a stacked structure in which InGaN layers and InAlGaN layers are alternately stacked one above another.

The super-lattice layer 300 may be grown on the second n-type semiconductor layer 230 in the chamber by MOCVD. The super-lattice layer 300 may be grown in a temperature range similar to that of the second n-type semiconductor layer 230. That is, the super-lattice layer 300 may be grown at a relatively low temperature, for example, at 800° C. to 900° C.

Referring again to FIG. 6, the super-lattice layer 300 may also be formed on a slope of a V-pit ($\alpha$) that includes a plane different from a growth direction plane of the nitride semiconductor layer. That is, a portion of the V-pit ($\alpha$) may be buried in the super-lattice layer 300. Thus, the V-pit ($\alpha$) may be provided to include the portions of the supper-lattice layer 300 and the n-type semiconductor layer 230. However, the slope of V-pit ($\alpha$) has a relatively low growth rate, whereby the super-lattice layer 300 formed on the slope of V-pit ($\alpha$) may have a very small thickness as compared with the thickness of the super-lattice layer 300 formed on the second n-type semiconductor layer 230. With such characteristics, the size of the V-pit ($\alpha$) formed on the second n-type semiconductor layer 230 may be increased. That is, the thickness of the V-pit ($\alpha$) may be increased corresponding to the thickness of the super-lattice layer 300 and the diameter (d2) of the V-pit ($\alpha$) may be increased in proportion to increase in thickness thereof.

Figure 7:
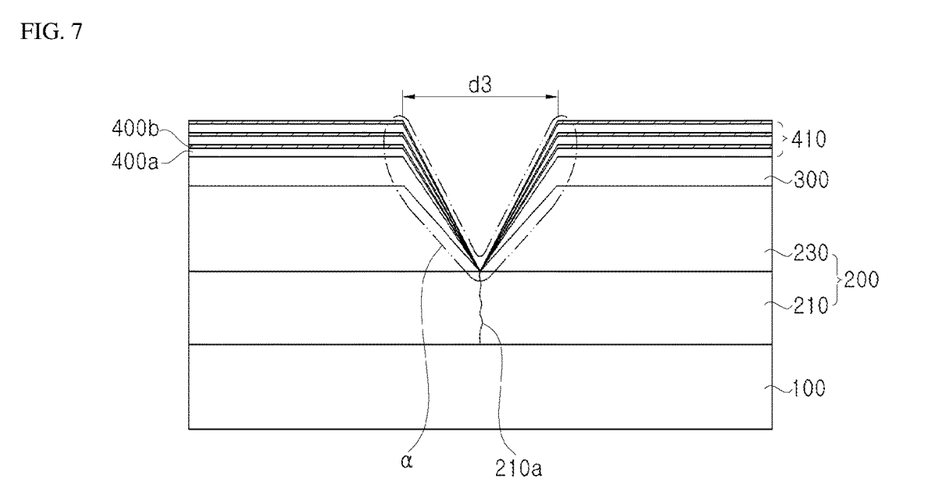
Figure 8:
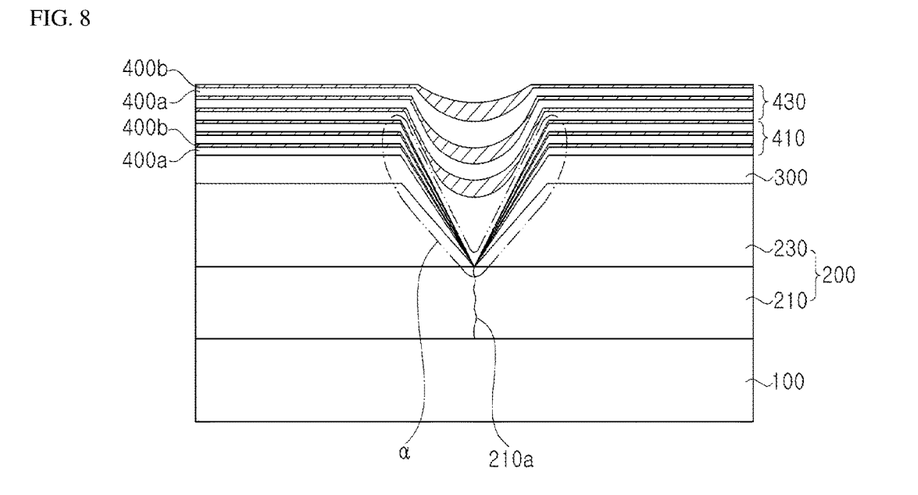
Figure 9:
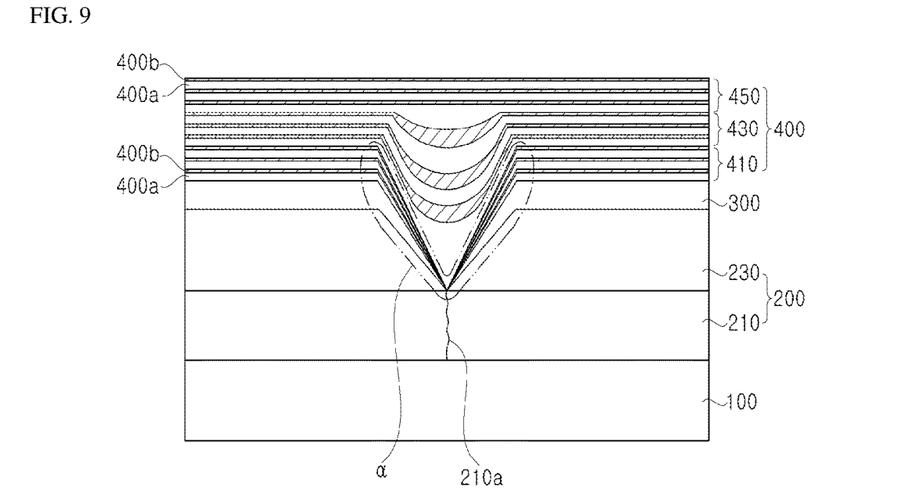

Referring to FIG. 7 to FIG. 9, the active layer 400 may be formed on the super-lattice layer 300. The active layer 400 may include a first active layer 410, a second active layer 430 and a third active layer 450, which are classified according to formation sequence and growth method.

Referring to FIG. 7, the first active layer 410 may be formed on the super-lattice layer 300. The first active layer 410 may include at least one barrier layer 400a and at least one quantum well layer 400b. Accordingly, the first active layer 410 may be formed by alternately repeating a process of forming the barrier layer 400a and a process of forming the quantum well layer 400b. For example, when the barrier layer 400a includes a GaN layer, the barrier layer may be grown by introducing a Ga source, an N source and an $N_2$ carrier into the chamber. Further, when the quantum well layer 400b includes, for example, an InGaN layer, the quantum well layer 400b may be grown by introducing an In source, a Ga source, an N source, and an $N_2$ carrier into the chamber. The first active layer 410 may be formed by alternately repeating the process of forming the barrier layer 400a and the process of forming the quantum well layer 400b.

The thickness of the V-pit ($\alpha$) may be increased corresponding to the thickness of the first active layer 410 and the diameter (d3) of the V-pit ($\alpha$) may be increased in proportion to the increase in thickness of the V-pit ($\alpha$).

In order to realize improvement in ESD prevention by the V-pit ($\alpha$), the V-pit ($\alpha$) is required to have a predetermined size or more. Accordingly, the first active layer 410 has a thickness such that the V-pit ($\alpha$) is formed to a diameter (d3) of greater than 100 nm, and may include a plurality of barrier layers 400a and a plurality of quantum well layers 400b corresponding thereto. If the V-pit ($\alpha$) formed through the second n-type semiconductor layer 230 and the super-lattice layer 300 has a sufficient thickness, the process of forming the first active layer 410 can be omitted.

Referring to FIG. 8, the second active layer 430 may be formed on the first active layer 410. The second active layer 430 may be formed by alternately repeating a process of forming the barrier layer 400a and a process of forming the quantum well layer 400b.

The barrier layer 400a included in the second active layer 430 may be formed using not only $N_2$ but also $H_2$ as a carrier gas and may be grown at a low growth rate by controlling the flow rate of a source gas introduced into the chamber. Further, the barrier layer 400a included in the second active layer 430 may be grown at a relatively high temperature, for example, about 900° C. Since H₂ is used as a carrier gas in growth of the second active layer 430, the second active layer 430 may contain a large amount of H₂ unlike the first active layer 410.

As described above, the second active layer 430 may be deposited over a wide region of the first active layer 410 under such conditions, thereby promoting lateral growth of the second active layer 430.

Furthermore, the amount of sources such as Ga, N, and the like to be deposited on the V-pit (α) can be increased due to H₂ having high momentum. As the second active layer 430 is grown, the diameter of the V-pit (α) gradually decreases such that the V-pit (α) is filled with the barrier layer 400a and the quantum well layer 400b. In some exemplary embodiments, the V-pit (α) may be completely filled with the second active layer 430.

Referring to FIG. 9, the third active layer 450 may be formed on the second active layer 430. The V-pit (α) may be partially or completely filled with the second active layer 430 such that the third active layer 450 disposed on the second active layer 430 includes at least one continuous quantum well layer 400b. Further, the quantum well layer 400b may have a flat structure. As such, with the quantum well layer 400b disposed on the V-pit (α) and having such a continuous flat structure, the semiconductor light emitting device can secure a sufficient luminous region while improving an ESD prevention effect.

The growth condition of the barrier layer 400a of the third active layer 450 may be the same as the growth condition of the barrier layer 400a of the second active layer 430. Alternatively, the growth condition of the barrier layer 400a of the third active layer 450 may be the same as the growth condition of the barrier layer 400a of the first active layer 410.

Figure 10:
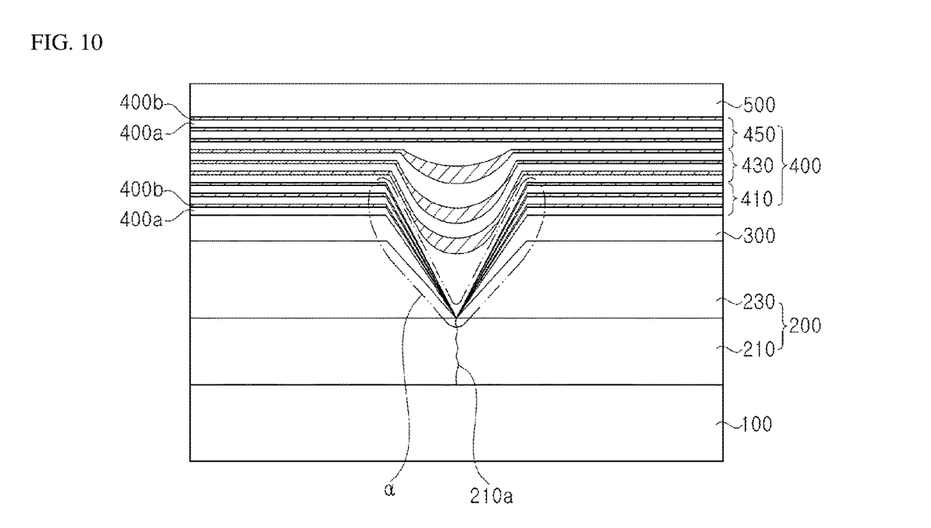

Referring to FIG. 10, an electron blocking layer 500 may be formed on the active layer 400. The electron blocking layer 500 may include a nitride semiconductor layer generally having a broader energy bandgap than the p-type semiconductor layer 600.

Figure 11:
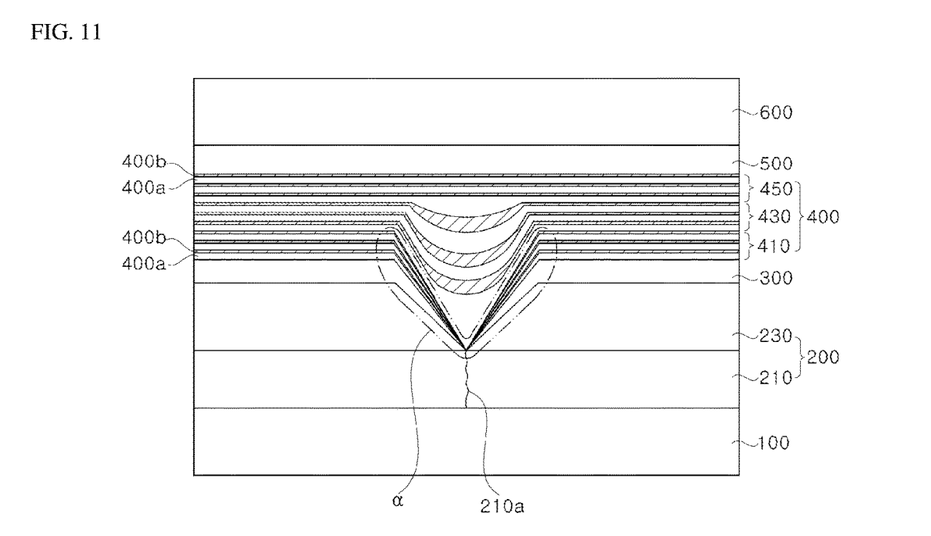

Referring to FIG. 11, the p-type semiconductor layer 600 may be formed on the electron blocking layer 500. The p-type semiconductor layer 600 may include a nitride semiconductor layer, such as (Al, In, Ga)N, and may be grown on the electron blocking layer 500 by MOCVD or the like. The p-type semiconductor layer 600 may include p-type dopants, for example, Mg dopants.

Only a few implementations and examples are described and other implementations, enhancements and variations can be made based on what is described and illustrated in this patent document.

We claim:

1. A semiconductor light emitting device comprising:
an n-type semiconductor layer;
a V-pit formed through at least part of the n-type semiconductor layer;
an active layer disposed on the n-type semiconductor layer and having a first, second, third active layers that are formed over one another, wherein parts of the first active layer and the second active layer fill the V-pit and the third active layer has a region located over the V-pit and another region located over remaining parts of the first active layer and the second active layer; and
a p-type semiconductor layer disposed on the active layer,
wherein the first active layer includes barrier layers and well layers that converge toward a point on the n-type semiconductor layer that is a starting point for the V-pit, and
wherein the region and another region of the third active layer form a continuous flat top surface that is opposite to a bottom surface of the third active layer facing the second active layer.

2. The semiconductor light emitting device according to claim 1, wherein the first portion is located under the second portion and the first portion is configured to increase a size of the V-pit.

3. The semiconductor light emitting device according to claim 1, wherein an uppermost end of the V-pit has a diameter of 100 nm or more.

4. The semiconductor light emitting device according to claim 1, wherein the second active layer is located to completely fill the V-pit.

5. The semiconductor light emitting device according to claim 1, wherein the second active layer comprises hydrogen molecules (H2).

6. The semiconductor light emitting device according to claim 1, wherein the barrier layers and the well layers are alternately stacked one above another.

7. The semiconductor light emitting device according to claim 6, wherein the barrier layers comprise a GaN layer and the well layers comprise an InGaN layer.

8. The semiconductor light emitting device according to claim 1, further comprising:
a substrate having a different crystal structure than the n-type semiconductor layer.

9. The semiconductor light emitting device according to claim 8, wherein the n-type semiconductor layer comprises:
a first n-type semiconductor layer disposed on the substrate and comprising a dislocation caused by a difference in crystal structure between the substrate and the n-type semiconductor layer; and
a second n-type semiconductor layer disposed on the first n-type semiconductor layer,
wherein the first n-type semiconductor layer has less defect density than the second n-type semiconductor layer.

10. The semiconductor light emitting device according to claim 9, wherein the V-pit is formed from the second n-type semiconductor layer corresponding to a location of the dislocation of the first n-type semiconductor layer.

11. The semiconductor light emitting device according to claim 1, further comprising:
a super-lattice layer interposed between the n-type semiconductor layer and the active layer.

12. The semiconductor light emitting device according to claim 11, wherein the super-lattice layer is configured to increase a size of the V-pit.

13. The semiconductor light emitting device according to claim 1, further comprising:
an electron blocking layer interposed between the active layer and the p-type semiconductor layer.

14. A semiconductor light emitting device comprising:
a substrate;
an n-type semiconductor layer formed over the substrate and having a non-flat portion for forming a pit;
an active layer formed over the n-type semiconductor layer and having a first, a second, and third active layers that are disposed over one another, each of the first and second active layers includes barrier layers and well layers extending in the pit; and
a p-type semiconductor layer formed over the active layer, wherein the first active layer includes barrier layers and well layers that converge toward a point on the n-type semiconductor layer, and wherein the third active layer has continuous flat well layers.

15. The semiconductor light emitting device of claim 14, wherein the surface of the third active layer has a flat shape.

16. The semiconductor light emitting device of claim 14, wherein the n-type semiconductor layer includes a first n-type semiconductor layer and a second n-type semiconductor layer having a higher defect density than the first n-type semiconductor layer.

17. The semiconductor light emitting device of claim 14, wherein the active layer includes multiple layers, each layer having a barrier layer and a quantum well layer.

18. The semiconductor light emitting device of claim 14, wherein the pit has size depending on the n-type semiconductor layer and the active layer.

* * * * *